United States Patent

[11] 3,611,171

[72] Inventor John C. Black
Endwell, N.Y.
[21] Appl. No. 884,092
[22] Filed Dec. 11, 1969
[45] Patented Oct. 5, 1971
[73] Assignee International Business Machines Corporation
Armonk, N.Y.

[54] INTEGRATED CIRCUIT VIDEO AMPLIFIER
16 Claims, 11 Drawing Figs.

[52] U.S. Cl. .......... 330/17, 330/19, 330/38
[51] Int. Cl. .......... H03f 3/18
[50] Field of Search .......... 307/303; 330/17, 19, 38 M

[56] References Cited
UNITED STATES PATENTS

| | | | |
|---|---|---|---|
| 3,500,220 | 3/1970 | Buckley | 330/19 |
| 3,509,364 | 4/1970 | Buckley | 330/38 X |

*Primary Examiner*—Roy Lake
*Assistant Examiner*—Lawrence J. Dahl
*Attorney*—Hanifin and Jancin ABSTRACT: A low cost, linear video amplifier requires no resistors making it especially adaptable for heavily integrated monolithic fabrication, and is characterized by wideband response, low and equal power dissipation in each transistor in the same stage for minimum local temperature gradients, gain substantially independent of voltage supply levels, supply variations and, within limits, ambient temperature variations. The transistors of each stage are physically identical to provide matched base-emitter voltage-current characteristics. Each stage of the amplifier comprises *m* transistor amplifiers with *n* transistors operated as diodes (i.e., short-circuited base-collector electrodes) and connected in parallel between the base and emitter electrodes of the amplifiers to provide a current gain of m/n. One or more succeeding stages of generally similar construction are comprised of transistors of the same conductivity type and the transistor-diodes of each stage are connected to and receive their input current from the diodes and the emitter electrodes of the next preceding stage.

The improved amplifier is particularly useful as an accurate, single or multiple constant current source or as a resistorless wideband gain element providing for more complex amplifier circuits.

INVENTOR

JOHN C. BLACK

BY John D. Crane

AGENT

| CIRCUITS COMBINED | CURRENT IN COMBINED CIRCUITS |
|---|---|
| 1 OR 2 | I |
| 3, 4, 5 OR 6 | 3/2 I |
| 1 & 2 | 2I |
| 1 & 3 | 5/2 I |
| 3 & 4 | 3I |
| 1 & 2 & 3 | 7/2 I |
| 1 & 3 & 4 | 4 I |
| 3 & 4 & 5 | 9/2 I |
| 1 & 2 & 3 & 4 | 5 I |
| 1 & 3 & 4 & 5 | 11/2 I |
| 3 & 4 & 5 & 6 | 6 I |
| 1 & 2 & 3 & 4 & 5 | 13/2 I |
| 1 & 3 & 4 & 5 & 6 | 7 I |
| 1 & 2 & 3 & 4 & 5 & 6 | 8 I |

$I_1 \cong Ii$ $I_2 \cong 2.5 Ii$ $I_3 \cong 4.5 Ii$ $I_4 \cong 81 Ii$

INTEGRATED CIRCUIT VIDEO AMPLIFIER

BACKGROUND OF THE INVENTION

This invention relates generally to the field of small signal, linear amplifiers although the improved circuit shown herein may be used for other applications requiring the characteristics of the circuits of this invention.

The improved linear amplifier shown herein is particularly well adapted to being constructed by monolithic construction techniques and, in fact, for best results requires the inherent capability of such monolithic construction techniques to match the characteristics of the various circuit elements. Not only does the monolithic construction improve the performance but also reduces the cost and size of the resulting structure.

The improved amplifier shown herein is constructed for the most part of transistors and requires a minimum of resistors, in most instances only one. As a consequence, the number of circuits for each monolithic chip can be increased because the number of resistors is reduced. Additionally, the resistors that are required can be discrete components and thus separated from the chip entirely although monolithic-type resistors are acceptable for the normal operation of the invention.

The improved amplifier of the present application makes use of techniques similar to those disclosed in U.S. Pat. No. 3,392,342 of R. Ordower entitled, "Transistor Amplifier with Gain Stability"; and the material contained therein is hereby incorporated by reference. This patent shows a basic transistorized current amplifier concept which is used in the present application.

The amplifier concept shown in the Ordower patent has been employed as shown in a copending application, Ser. No. 811,113, filed Mar. 27, 1969, by F. Buckley, and assigned to the assignee of the present application, to create larger current gains than those obtained in single stages. Said copending application is hereby incorporated herein by reference.

Certain problems, however, develop with these prior approaches when it is desired to produce large current gains. One problem is that in order to produce high gains, a relatively large number of amplifier stages must be employed. A second problem encountered with typical prior art devices is that the accuracy of the gain for each stage is not as high as would be desirable for certain applications, such as video amplifiers.

A third problem, and a necessary outgrowth of the previous two problems, is that the proposed solutions to the above-mentioned problems has necessitated the construction of relatively complex circuits, which as a result, increase the construction cost.

OBJECTS OF THE INVENTION

It is a primary object of this invention to overcome the problems encountered in prior art devices. Specifically, it is an object of this invention to reduce the number of transistors required to produce a predetermined gain.

It is an additional object of this invention to provide a circuit capable of providing predetermined gains with an improved accuracy over prior art devices.

It is another object of this invention to provide a bias circuit having the capability of providing a plurality of different constant current sources where each current is a precise multiple or submultiple of other currents.

It is a further object of this invention to provide improved linear current amplifiers at a lower cost.

SUMMARY OF THE INVENTION

In the various preferred embodiments of this invention, amplifier stages, each utilizing the basic concept taught by Ordower, are employed to produce a linear amplifier with accurate gain. Each amplifier stage comprises one transistor or a plurality of transistors with their emitters connected together and their bases connected together. Across the base-emitter junction of the transistor(*s*) is at least one diode with a voltage-current characteristic essentially matching the base-emitter voltage-current characteristic of the transistors. The collectors of the transistors may be connected together although this is not a requirement in any of the preferred embodiments. A given current input is provided to the base circuit of the transistors. The input current divides between the base circuit and the diodes shunting the base-emitters of the transistors. The output current of one stage then becomes the combination of the emitter currents added to the input current to the given stage; and this output current provides the input current to a second similarly constructed stage. This improved version allows the current through the shunt diode to be delivered to the load circuit. In the prior art circuits, this diode current was lost. In a typical circuit using two transistors and one shunt diode, the output current of the stage is increased by 50 percent. In a circuit with three transistors and one diode, the current is increased by 30 percent. Thus, by adding the stage input current to the amplifier emitter currents of any one stage, the gain per stage can be improved over prior art devices and thus produce a network with a higher gain and greater accuracy than was previously possible with the same number of transistors.

The requirements and description of the inventive linear amplifier and the preferred embodiment thereof will become more clear from the following more particular description of the various preferred embodiments as illustrated in the accompanying drawings.

DESCRIPTION OF THE INVENTION

Figure 1A:
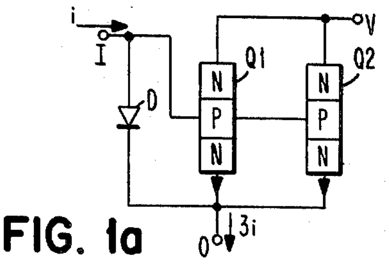
FIGS. 1*a* and 1*b* are schematic diagrams of typical amplifier stages used within the circuits of this invention.

Referring now to FIG. 1*a*, the circuit diagram there shown is of a typical amplifier stage employed by the present invention. Transistors Q1 and Q2 are connected such that the emitters, the bases, and the collectors of each of transistors Q1 and Q2 are connected to each other. A diode D is connected across the base-emitter junction of the two transistors Q1 and Q2 in the manner as shown in FIG. 1*a*. An input terminal *i* is provided for each amplifier stage. The input current *i* drives the amplifier stage in the direction as indicated by the arrow next to terminal I. The terminal labeled V is a supply input for the amplifier stage having a voltage at terminal V which is positive with respect to the voltage at terminal O. Terminal O constitutes the output of the amplifier stage of FIG. 1*a*.

When the base-emitter voltage-current characteristics of transistors Q1 and Q2 are matched to the voltage-current characterisics of diode D, the input current into terminal I is amplified by the amplifier stage and for the circuit shown, the output current would be 3*i*, while the input current would be *i*.

It is important to note, however, that the voltage-current characteristics of diode D must be essentially identical to the base-emitter voltage-current characteristics of the transistors Q1 and Q2. It should further be noted that the current at the input terminal I should be of a value so as to insure that the transistors Q1 and Q2 are always conducting and operating essentially in their linear range of operation.

Figure 1B:
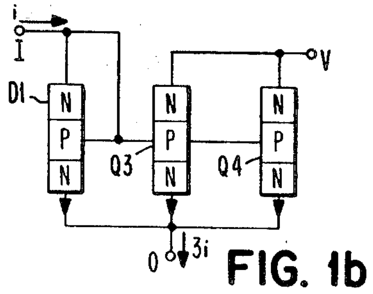

Since it is extremely difficult to fabricate a diode with essentially the same characteristics as a transistor base-emitter junction, it would be expected that the amplifier stages of the present invention would be manufactured so as to have a circuit configuration of that shown in FIG. 1*b*.

FIG. 1*b* shows three transistors of the same conductivity-type connected in the following manner. The bases, emitters, and collectors of two transistors, Q3 and Q4, are connected to each other as shown in FIG. 1*b*. A third transistor D1 is connected in such a manner that it acts like a diode. This is accomplished by shorting the base and the collector of D1 together. The base-collector connection of D1 is connected to the bases of transistors Q3 and Q4 and constitutes the input circuit to each amplifier stage. The input current is driven into terminal I and is in the direction of the arrow as shown in FIG. 1*b*.

The supply input V is connected to the common collectors of transistors Q3 and Q4. The supply voltage is at a positive level relative to the voltage at the emitters of transistors Q3 and Q1. The emitter connection of D1 and the emitters of the two transistors Q3 and Q4 are wired together and constitute an output circuit. The output is shown at terminal O.

Assuming that the base-emitter voltage-current characteristics of the two transistors Q3 and Q4 are essentially the same as those of D1, the gain of the amplifier stage shown in FIG. 1*b* is approximately 3, that is, the input current *i* will be amplified to 3*i* at the output terminal O.

The circuit diagram as shown in FIG. 1*b* is, in actuality, a more practical means for constructing amplifier stages of the subject invention. There are several reasons for preferring the circuit diagram of FIG. 1*b* to that of FIG. 1*a*. Firstly, it has proven in the past to be highly difficult, if not impossible to manufacture diodes with essentially the same voltage-current characteristics as the base-emitter junction of a transistor. Without the proper matching of the diode to the transistors, it has proved to be nearly impossible to produce an amplifier with sufficient accuracy of gain to be worthwhile in most current amplifier applications.

A second reason for preferring the configuration as shown in FIG. 1*b* is that the manufacturing becomes especially easy. Each of the transistors Q3 and Q4 can be manufactured at the same time as the diode-connected transistor D1. In fact, each of these transistors is typically found on the same monolithic chip and is manufactured at the same time. Such uniformity of manufacture insures that the diode-connected transistor D1 has essentially the identical base-emitter characteristics of transistors Q3 and Q4.

A third reason for preferring the configuration in FIG. 1*b* is that the fabrication of this circuit is less expensive as compared to manufacturing the circuit of FIG. 1*a* because all the elements of the active amplifier can be fabricated at the same time.

A fourth reason for preferring the circuit configuration of FIG. 1*b* is that each of the transistors when formed in close proximity to each other in a single monolithic chip can be operated at approximately the same temperature in an operational device. Since the characteristics of transistors are known to be temperature sensitive, the fabrication of the amplifier stage on a single chip facilitates the maintenance of essentially identical base-emitter characteristics between the transistors Q3 and Q4 and diode connected transistor D1.

Figures 2A, 2B:
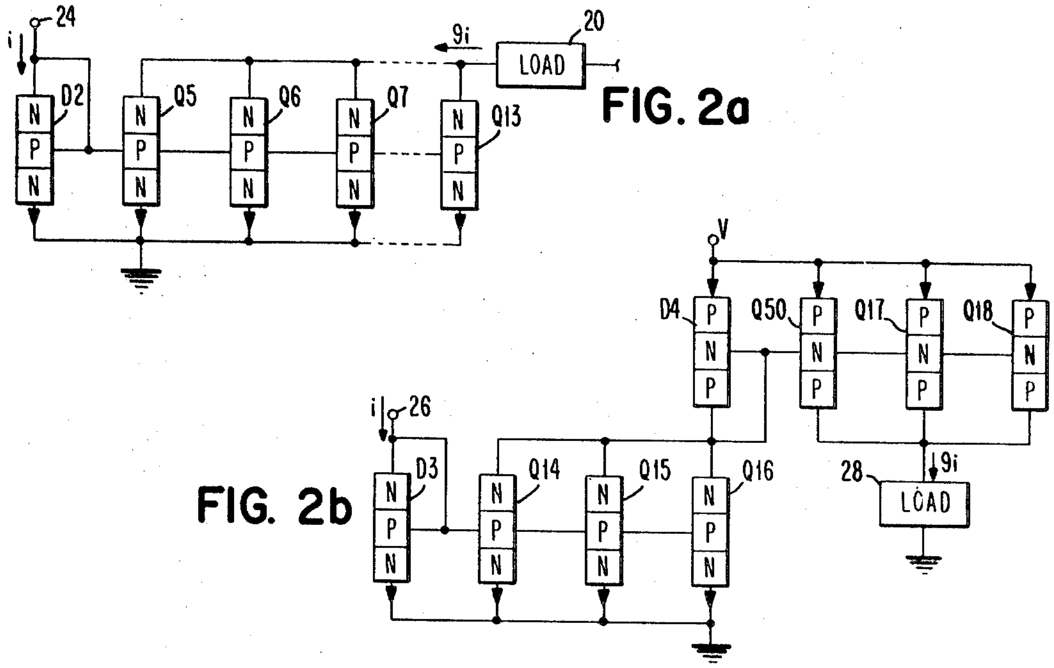
FIGS. 2*a* and 2*b* are circuit diagrams of amplifiers for obtaining a current gain of approximately 9 using prior art teachings.

Referring now to FIG. 2*a*, a circuit is shown which will perform current amplification in accordance with the teachings in the Ordower patent. The configuration in FIG. 2*a* shows a diode-connected transistor D2 in combination with nine transistor elements Q5–Q13 some of which are not shown but are implied by the dotted lines. Each of the nine transistors is connected such that each of the bases, collectors, and emitters of each of the transistors is connected to the same element of all the other transistors as is shown in FIG. 2*a*. The diode connected transistor D2 shunts the base-emitter junction of each of the nine transistors Q5–Q13. Load element 20 is placed in the common collector line of the transistors Q5–Q13. Assuming that the diode characteristics are matched to the base-emitter characteristics of the transistors, with an input current *i* into terminal 24, a current of approximately 9*i* will flow through load 20, assuming no error due to base currents. Thus, the ideal gain of the circuit in FIG. 2*a* will be nine and can be constructed from 10 semiconductor elements.

FIG. 2*b* shows an amplifier with a theoretical current gain of nine. This circuit comprises two amplifier stages wherein the transistors of the different stages are of different conductivity types.

The first amplifier stage comprises a diode-connected transistor D3 and three transistors Q14, Q15 and Q16 with their emitters, bases, and collectors connected together. The diode-connected transistor D3 shunts the base-emitter junctions of the three transistors Q14, Q15 and Q16. The collectors of the three transistors Q14, Q15 and Q16 are connected to the input circuit of a second amplifier stage. The second amplifier stage comprises the elements of D4, Q50, Q17 and Q18. The transistors in the second amplifier stage have a different conductivity type from those of the first amplifier stage. However, the connections of the various elements within the second amplifier stage are essentially the same as those in the first amplifier stage. That is, the emitters, the bases, and the collectors are connected to each other as shown in FIG. 2*b*. Diode-connected transistor D4 shunts the base-emitter junctions of the three transistors Q50, Q17 and Q18. By combining the collector circuits of the three transistors Q50, Q17 and Q18, the total current in load 28 is approximately 9*i* where *i* is the value of the input current at input terminal 26.

Figure 2C:
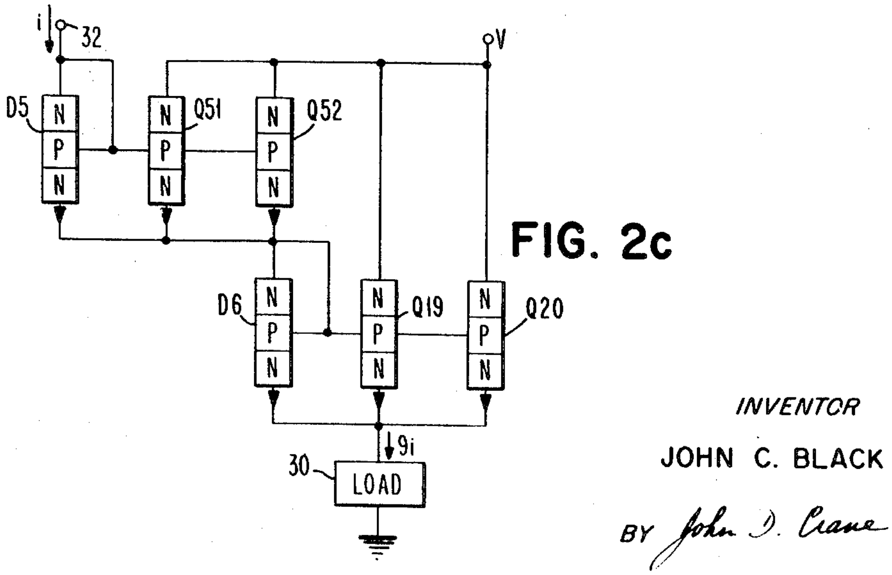
FIG. 2*c* shows one embodiment of the improved amplifier of this invention for obtaining a current gain of approximately 9.

FIG. 2*c* shows a form of the present invention which produces a current gain of approximately nine. In this particular circuit, there are two amplifier stages, the first amplifier stage comprising elements D5, Q51 and Q52 while the second amplifier stage comprises the elements D6, Q19 and Q20. Each amplifier stage employs a diode-connected transistor which shunts the base-emitter junction of two transistors that are connected with common emitters, common bases, and common collectors like the circuit of FIG. 1*b*. This circuit of FIG. 1*b* is connected such that the output terminal O of the first amplifier stage is connected to the input terminal I of the second amplifier stage. Load 30 is then connected in the output circuit of the second amplifier stage and for the circuit shown in FIG. 2*c*, the current in the load is approximately nine times the current entering input terminal 32.

For all of the circuits shown in FIGS. 2*a*, 2*b* and 2*c*, the circuitry is designed to give a current gain of approximately nine. There are, however, some readily apparent advantages to the circuit in FIG. 2*c*. In the first place, only six semiconductor elements are required in order to produce a current gain of nine as compared to the other circuits which require either eight or 10 semiconductor elements. A second apparent advantage is that the circuitry of FIG. 2*c* requires semiconductor elements of the same conductivity type and thus could conceivably be manufactured on a single chip in a single manufacturing process.

As will be subsequently shown, the characteristics of the three circuits of FIGS. 2*a*, 2*b* and 2*c* are such that the accuracy for the circuit in FIG. 2*c* is much greater than that for either of the other circuits shown. That is, while each circuit is designed so as to ideally produce a current gain of nine, for given characteristics of transistor elements, the circuitry of FIG. 2*c* produces the most accurate results.

It has been shown in the Buckley application, that the ratio of output to input current of circuits like that shown in FIG. 2*a* is defined by the following equation:

$$I_{out}=\frac{\alpha m/n}{1+\frac{\alpha m}{\beta n}}I_{in} \qquad \text{Eq. 1}$$

where $m$ is the number of amplifiers and $n$ is the number of diodes connected in parallel and connected across the base-emitter junctions of the amplifiers. Where $\alpha=\beta/(\beta+1)$ and the base-emitter voltage-current characteristics are matched between the diode connected transistors and the transistors of a given amplifier stage, the solution for equation 1 when applied to he circuitry of FIG. 2*a* shows that the output current is defined by the following equation:

$$I_{out}=9I_{in}\frac{(\beta)}{\beta+10} \qquad \text{Eq. 2}$$

Solving equation 2 when $\beta=47$, $I_{out}=(0.82)\ 9I_{in}$.

Applying equation 1 to the circuitry of FIG. 2*b* and further assuming that $\beta$ is equal to 47, the output current in load 28 is defined by the following relationship:

$$I_{out}=(0.848)\ 9I_{in}$$

Since the circuitry in FIG. 2*c* is different from that in FIGS. 2*a* and 2*b*, the equation for determining the output load current is slightly different since the input current contributes to the output current due to the combining of the emitter currents of the transistors in each amplifier stage to the current in the diode connected transistor. Because of the combination of the input current and the emitter currents, equation 1 becomes equation 3 when applied to circuits of the type shown in FIG. 2*c*.

$$I_{out}=I_{in}+\frac{\alpha m/n}{1+\frac{\alpha m}{\beta n}} \qquad \text{Eq. 3}$$

Applying equation 3 to the amplifier stages as shown in FIG. 2*c*, assuming $\beta=47$ and $\alpha=47/48$, the output current in load 30 is defined by the following relationship:

$$I_{out}=(0.92)\ 9I_{in}.$$

Thus, by examining the various gains for the circuits shown in FIGS. 2*a*, 2*b*, and 2*c*, it becomes readily apparent that the circuitry of FIG. 2*c* is considerably more accurate than the circuit shown in FIGS. 2*a* and 2*b*. The reason for the greatly improved accuracy would appear to be the effect of the combining of the input current to the current in the transistors of each amplifier stage to yield an output current.

Figures 3A, 3B, 5B:
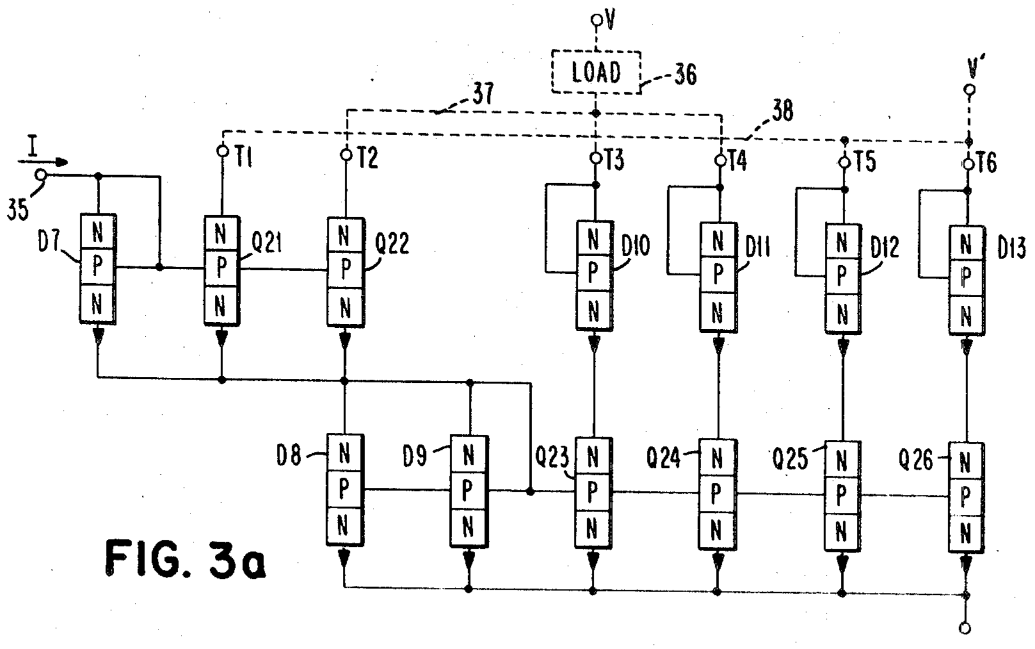
FIG. 3*a* shows another circuit configuration for an improved current amplifier constructed in accordance with the teachings of the present application.
FIG. 3*b* shows a table setting forth all possible connections of input terminals and the many different current values that can be obtained thereby.
FIG. 5*b* shows a table of the approximate load currents of the circuits in FIG. 5*a;*

Referring now to FIG. 3*a*, another embodiment of the present invention is shown. In this particular case, two amplifier stages are shown with the first amplifier stage comprising diode connected transistor D7 and transistors Q21 and Q22. The second amplifier stage comprises the diode-connected transistors D8 and D9 and transistors Q23, Q24, Q25 and Q26. The transistors in the second amplifier stage are connected such that the bases and the emitters are connected together. The collectors of each of the transistors in the second amplifier stage are each connected to diode-connected transistors D10, D11, D12 and D13. For example, diode connected transistor D10 is wired to the collector of transistor Q23. The purpose of the diode-connected transistors is to cause the collector-base voltage of Q23 to be substantially equal to that of diode-connected transistors D8, D9, i.e., zero.

the advantage of the circuit shown in FIG. 3*a* will become more apparent when we consider the various possible load currents that can be derived through the use of particular interconnections of load terminals. For example a load 36 is shown which appears between a voltage supply V and three of the six load terminals. The load 36 is connected to load terminals 2, 3, and 4 via wire 37. The remaining load terminals 1, 5, and 6 are connected via wire 38 to a positive supply labeled V'.

It is of interest to know the current in load 36 for the above-mentioned connection of load terminals. The current in load 36 is equal to the sum of the currents passing through load terminals 2, 3, and 4. From Table I, FIG. 3*b*, it is clear that the current passing through input terminal 2 is equal to I, the current applied to terminal 35. Also from FIG. 3*b* it is clear that the current passing through load terminal 3 and load terminal 4 is the same and equal to 3/2(I). Thus, the current in load 36 must be equal to 4I.

It is possible through the many interconnections of load terminals to produce different currents in a given load. The table in FIG. 3*b* lists a number of possible interconnections and the current gain of each specific combination of input terminals.

It should be noted at this time that a plurality of diode-connected transistors and a plurality of transistor elements can be used in each individual amplifier stage in any embodiment of the present invention. However, the ratio of transistors to diodes does have some effect upon the accuracy of gain within amplifier stages. It is clear from equation 3 that the accuracy of the gain achieved by any given amplifier stage is affected by the term $\alpha m/\beta n$. If this factor is small compared to one, the accuracy of a given amplifier stage as compared to the ideal accuracy becomes greater. In order to keep the term $\alpha m/\beta n$ small, the ratio of $m/n$ should be kept small. By keeping the ratio of $m/n$ less than or equal to two, the error per amplifier stage can be kept to a relatively small value. Such analysis points to a further reason why the circuits shown in FIG. 2*c* perform better than those shown in FIGS. 2*a* and 2*b*; namely, that the ratio of $m/n$ was kept at a value of 2. It should further be noted that an increase in the magnitude of $\beta$ will also produce amplifier stages with improved accuracy gain.

Figure 4:
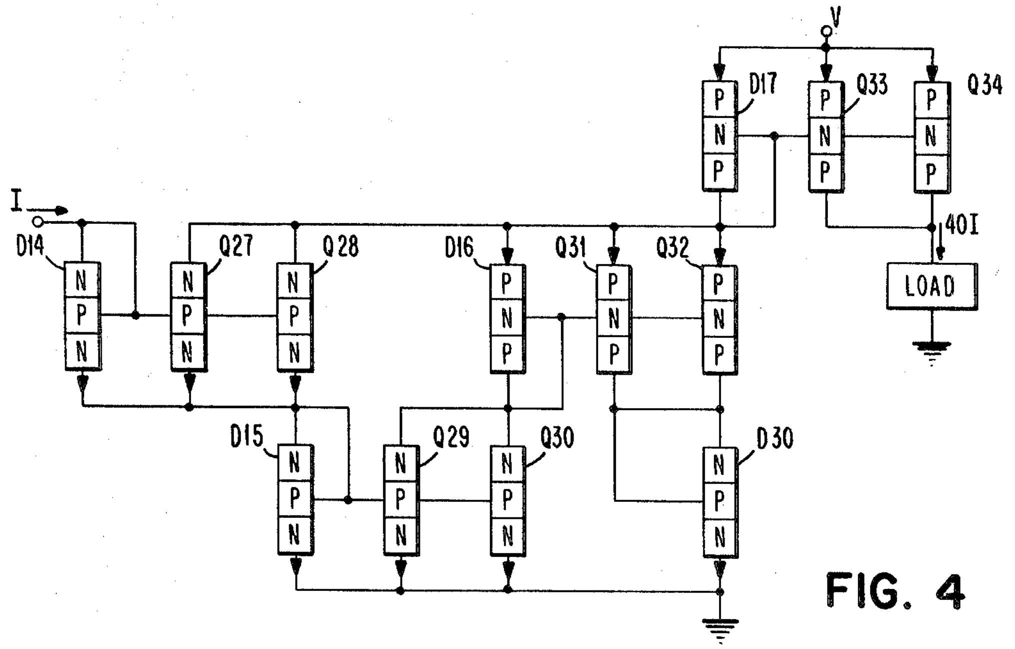
FIG. 4 shows another configuration for an improved amplifier characterized by this invention which uses transistors of two different conductivity types.

Referring now to FIG. 4, a multistage amplifier of the present invention is shown wherein transistors of different stages are of different conductivity types. The first and second amplifier stages comprise elements D14, Q27 and Q28 of the first amplifier stage and D15, Q29 and Q30 for the second amplifier stage. These amplifier stages use NPN-type semiconductor elements. The third and fourth amplifier stages comprise elements D16, Q31 and Q32 for the third stage and D17, Q33 and Q34 for the fourth stage. These stages employ semiconductor elements of the PNP type. Diode-connected transistor D30 is a voltage compensating diode to adjust the collector voltage of Q31 and Q32 to the same voltage as the collector-base of diode-connected transistor D16.

In the configuration as shown in FIG. 4, assuming that the error introduced for each stage is small, the current gain of the network shown is approximately 40. A gain of that magnitude could be obtained through any appropriate amplifier stages to the networks shown in FIGS. 2*c* and 3*a*, however, because the series connection of amplifier stages is required, the supply voltage required to operate the circuit necessarily increases with each series stage added. The configuration in FIG. 4 allows amplifier stages to be added without the requirement of a significantly greater supply voltage.

Figure 5A:
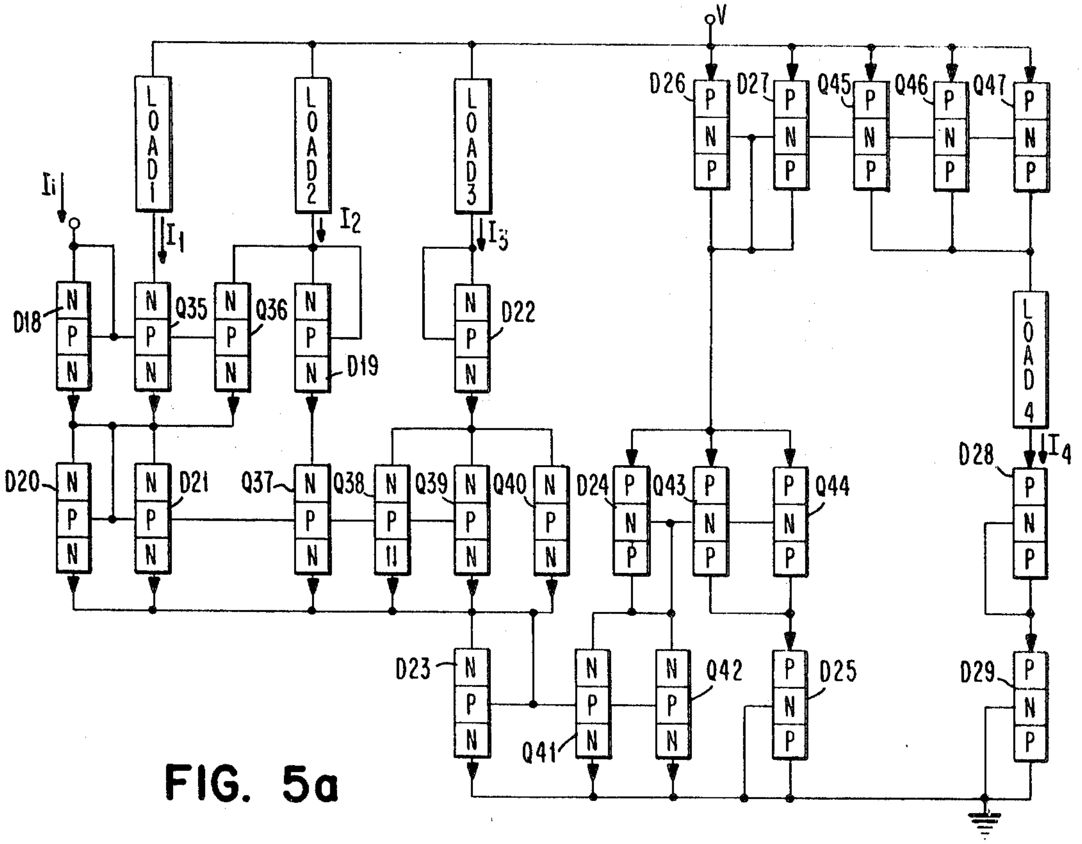
FIG. 5*a* shows another improved amplifier configuration with several load elements.

FIG. 5*a* shows a circuit similar to that shown in FIG. 4. The collectors of various amplifier stages have been combined so as to control the current through various loads. Particularly, load 1 is connected to the collector of transistor Q35 and has a current $I_1$ flowing through it.

Load 2 has a current $I_2$ flowing through it which is controlled by the current passing through transistors Q36 and Q37. Diode-connected transistor D19 is shown in the circuit between load 2 and the collector of transistor Q37 and has the function of compensating the voltage at the collector of Q37 so as to be approximately equal to the voltage at the input terminal of the amplifier stage containing transistor Q37.

Load 3 is connected such that a current $I_3$ passes through it which is controlled by the current passing through the collectors of transistor elements Q38, Q39 and Q40. A compensating diode-connected transistor D22 is connected between load 3 and the collectors of transistors Q38, Q39 and Q40 and also has the purpose of compensating the voltage at the collector terminals so as to be approximately equal to the voltage at the input to the amplifier stage.

Load 4 is connected such that a current $I_4$ passes through it and is controlled by the current passing through the collectors of transistors Q45, Q46 and Q47. In order to insure a more proper voltage relationship at the collectors of Q45, Q46, and Q47, diode-connected transistors D28 and D29 are employed for voltage compensation.

The relationship between the input current $I_i$ and the currents in the various load elements shown in FIG. 5*a* is listed in the table of FIG. 5*b*. The actual values of the current passing through each of the loads can only be approximated and is close to the value shown in the table. It should be recalled, however, that the gain characteristics of given amplifier stages are affected by the value of $\beta$ for the transistors of each amplifier stage as has been discussed earlier. The accuracy of the amplifiers is increased as the $\beta$ for the given transistor increases. Consequently, the relationship between the currents in the loads can be calculated for a given $\beta$ and can be made to more closely approximate the values shown in table 2 as the value of $\beta$ is made larger.

Figure 6:
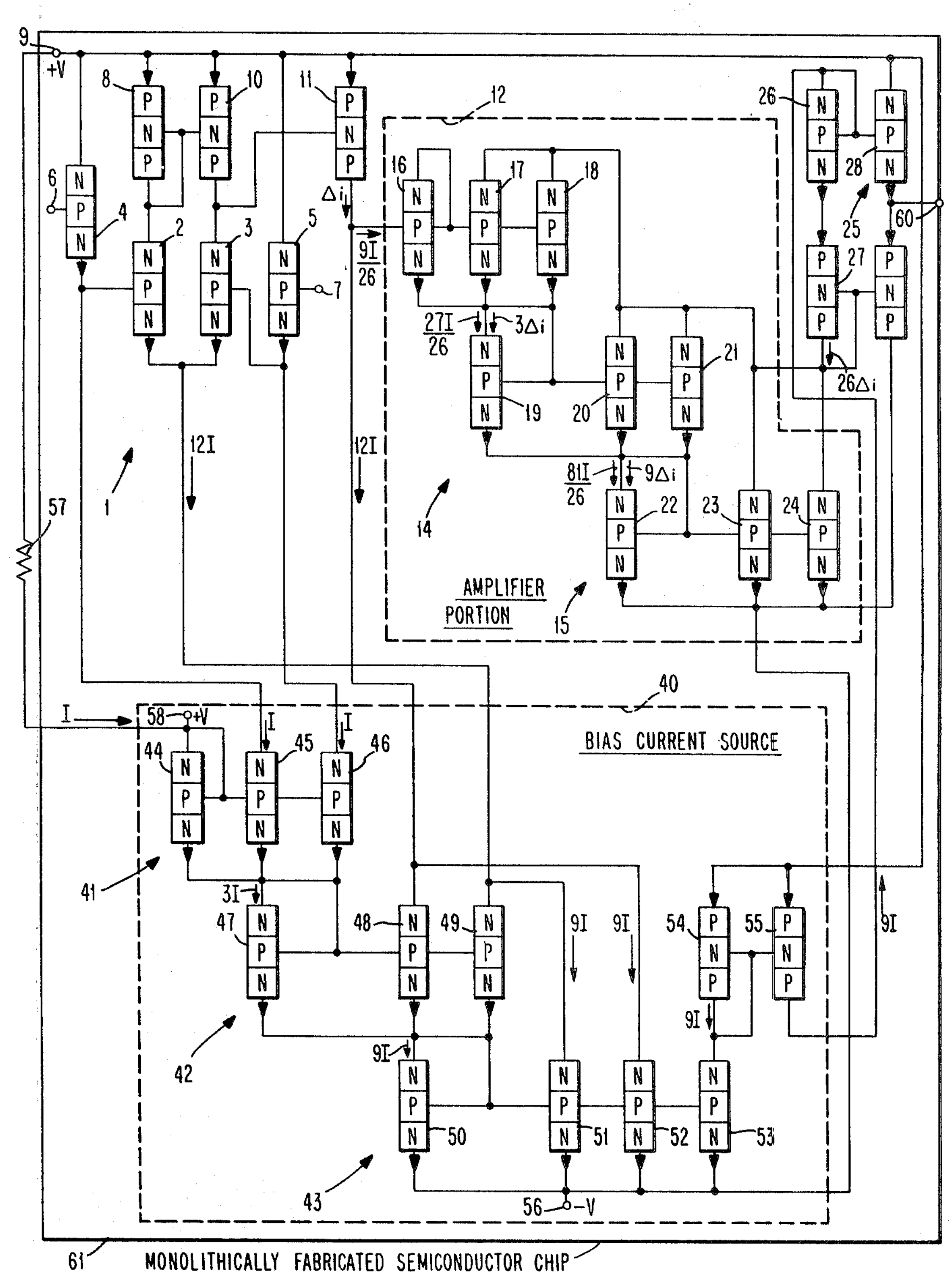
FIG. 6 shows a combination of novel amplifiers and a novel bias current source characterized by this invention.

FIG. 6 illustrates an amplifier which provides both a signal amplifier section and a multiple current source in accordance with the teachings of the present application. The amplifier is formed on a single semiconductor chip 61. The amplifier comprises a first differential amplifier stage 1 having a pair of NPN transistors 2 and 3 having their emitter electrodes connected together. A pair of Darlington-connected input transistors 4 and 5 couple signals from input terminals 6 and 7 to the base electrodes of the transistors 2 and 3.

A PNP transistor 8 having its base-collector electrodes short circuited to operate as a diode couples the collector electrode of the transistor 2 to a positive supply terminal 9 and provides the load for the transistor 2. A PNP transistor amplifier 10 operated as a current source connects the collector electrode of the transistor 3 to the terminal 9. The base-emitter voltage-current characteristics of the transistors 8 and 10 are substantially matched whereby the collector current of the transistor 10 will be maintained equal to the current flowing through the transistor 8.

A single-ended second stage is provided by a PNP transistor 11 having its base electrode connected to the collector output terminal of the transistor 3. The collector output terminal of the second stage amplifier 11 is connected to a three-stage amplifier section 12 which incorporates the teachings of the present improvement.

Specifically, the amplifier 12 comprises first, second and third similar stages 13, 14 and 15. The first stage 13 comprises an NPN transistor 16, having its base-collector electrodes short-circuited to act as a diode, and a pair of NPN transistor amplifiers 17 and 18 having their base-emitter junctions connected in parallel with the transistor-diode 16. The base-emitter voltage-current characteristics of the transistors 16, 17 and 18 are substantially matched whereby the collector current in each of the transistors 17 and 18 will be substantially equal to the current flowing through the transistor-diode 16.

The stage 14 comprises a first NPN transistor 19 having its base-collector electrodes short-circuited to operate as a diode and a pair of NPN transistor amplifiers 20 and 21 having their base-emitter junctions connected in parallel with the transistor-diode 19. The base-emitter voltage-current characteristics of the transistors 19, 20 and 21 are substantially matched whereby the collector current in each of the transistor amplifiers 20 and 21 is substantially equal to the current flowing through the transistor diode 19.

Stage 15 comprises an NPN transistor 22 having its base-collector electrodes short-circuited to operate as a diode and a pair of NPN transistor amplifiers 23 and 24 having their base-emitter junctions connected in parallel with the transistor-diode 22. The base-emitter voltage-current characteristics of the transistors 22, 23 and 24 are substantially matched whereby the current in each of the collectors of the amplifiers 23 and 24 is substantially equal to the current flowing through the transistor diode 22.

The collector electrodes of the transistor amplifiers 17, 18, 20, 21, 23 and 24 are connected to a push-pull common collector amplifier stage 25. The stage 25 comprises a series-connected NPN transistor 26 and PNP transistor 27, each of which have their base-collector electrodes short-circuited to operate as diodes. These transistor diodes 26 and 27 form the load for the amplifier section 12. The amplifier 25 also includes a series-connected NPN transistor amplifier 28 and PNP transistor amplifier 29. The base-emitter junctions of the amplifiers 28 and 29 are connected in parallel with the transistor diodes 26 and 27. The base-emitter voltage-current characteristics of the transistors 26 and 28 are matched and those of transistors 27 and 29 are matched, whereby the voltage established across the transistor diodes 26 and 27 by the current flowing therethrough controls the flow of current through the transistor amplifiers 28 and 29.

Bias currents for the amplifier circuit of FIG. 6 described immediately above are provided by a multiple bias current source 40 which incorporates the teachings of the present invention. The source 40 comprises first, second and third stages 41, 42 and 43. The first stage 41 includes an NPN transistor 44 having its base-collector electrodes short-circuited to operate as a diode and NPN transistor amplifiers 45 and 46 having their base-emitter junctions connected in parallel with the transistor-diode 44. The base-emitter voltage-current characteristics of the transistors 44, 45 and 46 are substantially matched whereby current flowing in each of the collector electrodes of transistors 45 and 46 is substantially equal to the current flowing through the transistor-diode 44.

The stages 42 and 43 are similar to stage 41, stage 42 comprising an NPN transistor-diode 47 and NPN transistor amplifiers 48 and 49 and stage 43 comprising an NPN transistor-diode 50 and NPN transistor amplifiers 51, 52, and 53. The emitter electrodes of the transistors 50–52, inclusive, are connected directly to each other and to a negative supply terminal 56.

The collector electrodes of the transistor amplifiers 48 and 52 are connected directly to each other to form a constant current bias source for the second stage amplifier 11. The transistor amplifiers 45 and 46 provide constant current bias sources for the Darlington-connected transistors 4 and 5. The amplifiers 49 and 51 provide a constant current bias source for stage 1 transistors 2 and 3.

The collector electrodes of the transistor amplifier 53 are connected to a PNP transistor 54 having its base-collector electrodes short-circuited to operate as a diode and having its emitter electrode connected to the supply terminal 9. The transistor diode 54 is connected in parallel with the base-emitter junction of a PNP transistor amplifier 55 which has its collector electrode connected to the transistor-diode 26 and provides a constant current bias source for the transistor-diodes 26, 27 and section 12. Input current to the source 40 is provided by a precision resistor 57 which has one terminal thereof connected to the positive supply terminal 9 and the other terminal thereof connected to an input terminal 58 of the source 40. The current flowing through the resistor 57 into the input terminal 58 is equal to the value of the supply voltage across terminals 9 and 56, less the voltage drops across the transistor diodes 44, 47 and 50 (in a typical embodiment, 6/10ths-volts drop across each transistor-diode) divided by the value of the resistor 57.

This bias current applied to the input terminal 58 is labeled I in FIG. 6. As indicated above, the collector currents (and therefore the emitter currents) of the transistor amplifiers 45 and 46 are substantially equal to the value I of the current flowing through the diode 44 whereby current having a value 3I flows into the transistor diode 47. This produces currents having a value of 3I in the collector and emitter circuits of the transistor amplifiers 48 and 49 and a current having a value of 9I to be applied to the transistor-diode 50. This in turn causes currents having a value of 9I to flow in the collector circuits of the transistors 51, 52 and 53. The transistor amplifiers 49 and 51 thereby provide a constant current 12I for stage 1. Similarly, the transistor amplifiers 48 and 52 provide a constant current 12I for the second stage amplifier 11. The transistor amplifiers 45 and 46 provide constant current currents I for the transistors 4 and 5.

Assuming that the voltage levels at the input terminals 6 and 7 are equal so that only steady state bias current flows through the various stages of the amplifier, the transistor-diode 8 causes an equal current in the transistor amplifier 10 to thereby force equal bias currents (i.e., 6I) through the transistors 2 and 3. The base current of the second stage transistor amplifier 11 is so small compared to the collector currents in the transistors 8 and 10 that it may be neglected for purposes of the present application, particularly when high Beta transistors are used.

The bias currents for the amplifier section 12 as well as for the output stage 25 are determined by the value of the currents flowing through the transistors 53, 54 and 55. Since the transistor amplifier 53 provides an output current of 9I which flows through the transistor diode 54, it causes a substantially equal constant current of 9I to flow from the positive supply terminal 9 through the transistor amplifier 55 into the diodes 26 and 27 through transistor amplifiers 17, 18, 20, 21, 23 and 24 and through the transistor diodes 19 and 22 to the negative supply terminal 56.

It is noted in an amplifier such as section 12 that input bias current is amplified with a gain exactly equal to the input signal gain of the amplifier. As will be seen below the input to output gain of the amplifier section 12 is 26; therefore, since the total bias current applied to the stage by the transistor 55 is 9I, the input bias current to the transistor-diode 16 is 9I/26.

Thus, the bias current in the transistor amplifiers 17 and 18 are equal to 9I/26. The bias current flow into the transistor diode 19 is therefore 27I/26 and similar valued bias currents flow in the transistor amplifiers 21 and 22. The bias current flow into the transistor diode 22 is equal to the bias current flowing into the transistor diode 22 is equal to 81I/26 whereby the bias currents flowing through the transistor amplifiers 23 and 24 are equal to 81I/26. The sum of the collector currents of amplifiers 17, 18, 20, 21, 23 and 24 therefore equal 9I.

Attention is directed to the fact that the various ratios of bias currents throughout the circuit of FIG. 6 will be maintained substantially constant irrespective of the voltage which is applied across the terminals 9 and 56 as long as all transistors are operated in their linear regions, i.e., neither at cutoff or saturation. Nor will these ratios vary with fluctuations in the applied voltage supply. The current gain in amplifier section 12 remains constant irrespective of the level of the applied voltage and irrespective of fluctuations in the applied voltage.

The steady state output current of the transistor 11 is set in value to the total emitter current of the transistors 2 and 3 to minimize the contribution of the Betas of the transistor amplifiers 10 and 11 (when they are matched) to the input offset voltage of the amplifier of FIG. 6.

A brief description of the operation of the amplifier of FIG. 6 to amplify input signals applied to the terminals 6 and 7 will now be made. Assume that the voltage level at the input terminal 7 becomes more positive than that at the input terminal 6. This causes an increase in the emitter currents of the transistor amplifiers 3 and 5. Since the total current flowing into the emitters of the transistors 2 and 3 is constant, an increase in the emitter current of the transistor 3 results in an equal decrease in the emitter current flowing through the transistor 2 and therefore a decrease in current through the transistor-diode 8. The decrease in the current through the transistor-diode 8 results in an equal decrease in the collector current of the transistor amplifier 10. The base current in the second stage amplifier 11 increases by an amount equal to the sum of the increase in the emitter current of the transistor 3 and the decrease in the collector current of the transistor 10. This increase in the base current of the transistor 11 is amplified by the Beta of the transistor producing an increase in the output current of the transistor 11 which is identified in FIG. 6 as $\Delta i$. The amplifier section 12 as described above has a current gain of approximately 26; and since the increase $\Delta i$ in the output current of the transistor 11 must flow into the input transistor diode 16, the current flowing through the transistor diode 27 will increase by $26\,\Delta i$. This increase in the signal current through the transistor-diode is derived from the output terminal 60 and the base-emitter circuit of amplifier 29. This produces an increase in the load current through the collector-emitter circuit of transistor amplifier 29 which is equal to the Beta of the transistor times $26\,\Delta i$.

An input signal of opposite polarity produces an increase in the load current through the amplifier 28.

The function of the transistor amplifier 12 is to provide an accurate, high bandwidth current gain and to terminate the collector electrode of the second stage transistor amplifier 11 into a low impedance.

The versatility of applicant's invention is apparent in FIG. 6; in one form (amplifier 12) it provides current amplification of input signals; in another form (source 40) it provides multiple constant current sources with stable currents having fixed ratios irrespective of supply variations. The invention aids in the design of amplifiers which do not require load and bias resistors. In the example illustrated in FIG. 6, only one resistor 57 is required to set the steady state current levels for all stages; and, since only one resistor is required it is economically feasible to use a precision resistor not formed in the monolithically fabricated semiconductor chip 61. With no resistors on the chip 61, it is feasible to provide much more heavily integrated transistor circuits on a semiconductor chip.

While the invention has been particularly shown and described with reference to preferred embodiments thereof, it will be understood by those skilled in the art that the foregoing and other changes in form and details may be made therein without departing from the spirit and scope of the invention. For example, it will be readily recognized by those of skill in the art that particular embodiments shown having one conductivity type of transistor may readily be modified so as to employ transistor elements of the other conductivity type. Other modifications will also be readily apparent to those skilled in the art.

What is claimed is:

1. A current amplifier having a gain characteristic substantially independent of temperature and bias current comprising:

a plurality of amplifier stages each having an input, an output, and a supply input, said plurality of amplifier stages being electrically connected such that the output of each amplifier stage is connected to the input of the next succeeding amplifier stage and the supply inputs of all the amplifier stages are connected together;

each of said amplifier stages comprising:

at least one first transistor of one conductivity type with base, collector and emitter electrodes;

at least one second transistor of the same conductivity type as said first transistor with base, collector, and emitter electrodes, and having a base-emitter voltage-current characteristic substantially matching the base-emitter voltage-current characteristics of said first transistors;

a first direct electrical connection between the collector electrode of each of said second transistors and the base electrode of each of said first and second transistors, said first direct electrical connection comprising the input of said first amplifier stage;

a second electrical connection between the collector electrodes of each of said first transistors, said second electrical connection comprising the supply input of said amplifier stage; and a third direct electrical connection between each of the emitter electrodes of said first and second transistors, said third electrical connection comprising the output of said amplifier stage.

2. A current amplifier having a gain characteristic substantially independent of temperature and bias current comprising:

a plurality of amplifier stages each amplifier stage having an input, and an output, said plurality of amplifier stages electrically connected such that the output of one amplifier stage is connected to the input of another amplifier stage; and each of said amplifier stages comprises:

at least one common emitter transistor with a base, collector, and emitter electrodes;

at least one other transistor with a base, collector, and emitter electrode, and having a base-emitter characteristic substantially like the base-emitter characteristic of said common emitter transistors;

a first electrical connection between the collector electrode of each of said other transistors and the base electrode of each of said common emitter transistors and said other transistors, said first electrical connection comprising an input to said amplifier stage;

a second electrical connection between each of the emitters of said other transistors and each of the emitters of said common emitter transistors, said second electrical connection comprising the output of said amplifier stage; and a plurality of electrical connections, each of said plurality of electrical connections connecting an associated external load to at least one of said collectors of said common emitter transistors.

3. The current amplifier in claim 1 wherein the first and second transistors of each amplifier stage are fabricated in close proximity to each other upon a single monolithic chip so as to improve the thermal characteristics of each amplifier stage.

4. The current amplifier in claim 2 wherein the common emitter transistors and the other transistors of each amplifier stage are fabricated upon a single monolithic chip so as to improve the thermal characteristics of each amplifier stage.

5. A current amplifier having a gain characteristic substantially independent of temperature and bias current comprising:

a first plurality of amplifier stages having active transistor elements of a first conductivity type and further having an input, and an output, said plurality of amplifier stages being series connected such that the output of one amplifier stage is connected to the input of another amplifier stage;

a second plurality of amplifier stages each stage having transistor elements of a second conductivity type and further having an input and an output, said second plurality of amplifier stages being series connected such that the output of one amplifier stage is connected to the input of another amplifier stage; and each of said amplifier stages comprising:

at least one common emitter transistor with a base, collector, and emitter electrode;

at least one other transistor with a base, collector, and emitter electrode, and having a base-emitter characteristic essentially like the base-emitter characteristic of said common emitter transistor;

a first electrical connection between the collector electrode of each of said other transistors and the base electrode of each of said common emitter transistors and said other transistors, said first electrical connection comprising an input to said amplifier stage;

a second electrical connection between each of the emitters of said other transistors and each of the emitters of said common emitter transistors, said second electrical connection comprising the output of said amplifier stage;

a third electrical connection between the input of the first series-connected amplifier stage of said second plurality of amplifier stages and the collectors of the common emitter transistors of the last series-connected amplifier of said first plurality of amplifier stages;

a fourth electrical connection between all of the collectors of said common emitter transistors in said first plurality of amplifier stages, excluding the last series connected amplifier stage, to a first current supply having an appropriate voltage for the conductivity type of transistor used in said first plurality of amplifier stages; and a fifth electrical connection between all of the collectors of said common emitter transistors in said second plurality of amplifier stages, excluding the first series connected amplifier stage, to a second current supply having a relative voltage of opposite polarity to the voltage of said first supply.

6. The current amplifier of claim 5 wherein the fourth electrical connection includes a plurality of load elements where each load element is inserted between at least one collector of said common emitter transistors and said first supply.

7. The current amplifier of claim 5 wherein the fifth electrical connection includes a plurality of load elements where each load element is inserted between at least one collector of said common emitter transistor and said second supply.

8. The current amplifier of claim 5 wherein the fourth electrical connection includes a plurality of loads, each load being connected between at least one collector of said common emitter transistors and said first supply and said fifth electrical connection includes a plurality of loads wherein each load is connected between at least one collector of said common emitter transistors in said second plurality of amplifier stages and said second supply.

9. A signal translating circuit comprising:

a predetermined number $n$ of first transistors and a predetermined number $m$ of second transistors of one conductivity type having substantially matched base-emitter voltage-current characteristics and each having base, emitter and collector electrodes, the emitter electrodes being connected directly to each other, the collector electrodes of the first transistors being connected directly to the base electrodes of each of said first and second transistors, the collector and the connected base electrodes being adapted for connection to a source of current having a value represented by I to produce in the collector electrode of each second transistor a current substantially equal in value to I/$n$, a predetermined number $x$ of third transistors of the same conductivity type having substantially matched base-emitter voltage-current characteristics and each having base, emitter and collector electrodes, the emitter electrodes of the third and the fourth transistors being connected directly to each other and adapted for connection with one voltage supply terminal, the collector electrodes of the second and fourth transistors being adapted for connection to a different terminal of the voltage supply, and the collector electrodes of the third transistors being connected directly to the base electrodes of the third and fourth transistors and also being connected directly to the emitter electrodes of the first and second transistors to produce in the collector electrode of each fourth transistor a current substantially equal in value of $[(m/n+1](I/xn$, $m$, $x$ and $y$ being integers equal to or greater than unity.

10. The circuit of claim 9 wherein the substantially matched transistors are monolithically fabricated in close proximity to each other on a single semiconductor chip.

11. The circuit as defined in claim 10 wherein the value of the current I is greater than zero, but less than a value which causes saturation in any of the transistors.

12. A single translating circuit comprising:

a predetermined number $n$ of first transistors and a predetermined number $m$ of second transistors of one conductivity type having substantially matched base-emitter and voltage-current characteristics and each having base, emitter and collector electrodes, the emitter electrodes being connected directly to each other, a voltage supply having first and second terminals, a source of current having a value represented by I, the collector electrodes of the first transistors being connected to the base electrodes of each of said first and second transistors, the collector and the connected base electrodes being connected directly to the source of current to produce in the collector electrode of each second transistor a current substantially equal in value to I/$n$, a predetermined number $x$ of third transistors and a predetermined number $y$ of fourth transistors of the same conductivity type having substantially matching base-emitter voltage-current characteristics and each having base, emitter and collector electrodes, the emitter electrodes of the third and the fourth transistors being connected directly to each other, the collector electrodes of the third transistor being connected directly to the base electrodes of the third and fourth transistors and also being connected directly to the emitter electrodes of the first and second transistors to produce in the collector electrode of each fourth transistor a current substantially equal in value to $[m/n+1]I/x$, the numbers $n$, $m$, $x$ and $y$ being intergers, each equal to or greater than unity, first means coupling the collector electrodes of the second and fourth transistors to the first supply terminal, and second means coupling the emitter electrodes of the first and fourth transistors to the second supply terminal.

13. The circuit of claim 12 wherein said source of current comprises a source of bias current connected directly to the junction between the base and collector electrodes of the first transistors and the base electrodes of the second transistors, and a source of input signals to be amplified connected directly to said junction.

14. The circuit of claim 12 wherein said source of current comprises a constant current source to produce in the collector electrodes of the second and fourth transistors constant bias currents having fixed ratios with respect to each other and with respect to the constant current source independent of their absolute values.

15. The circuit of claim 12 wherein at least one collector electrode of a second transistor is connected directly to at least one collector electrode of a fourth transistor to produce a selected value of bias current.

16. A circuit of claim 12 wherein said first means includes:

a predetermined number $s$ of fifth transistors and a predetermined number $x$ of sixth transistors of the opposite conductivity type having substantially matched base-emitter voltage-current characteristics and each having base, emitter and collector electrodes;

means connecting the emitter electrodes of the fifth and sixth transistors directly to each other and connecting the latter electrodes to the first supply terminal;

the collector electrodes of the fifth transistors being connected directly to the base electrodes of the fifth and sixth transistors, the latter collector electrodes and the base electrodes being connected and receiving all of the current from at least one collector electrode of the second and fourth transistors to produce in the collector electrode of each sixth transistor a current substantially equal in value to the current received by the fifth transistors from the collector electrodes of the second and fourth transistors divided by $s$, the numbers $s$ and $x$ being intergers each equal to or greater than unity.

PO-1050
(5/69)

UNITED STATES PATENT OFFICE
CERTIFICATE OF CORRECTION

Patent No. 3,611,171 Dated October 5, 1971

Inventor(s) John C. Black

It is certified that error appears in the above-identified patent and that said Letters Patent are hereby corrected as shown below:

Column 12, line 49, the sentence "(I/xn,m,x and y being integers equal to or greater than unity." should read --(I/x), the numbers n, m, x and y being integers equal to or greater than unity--.

Column 14, line 19, after "connected" insert -- to --.

Signed and sealed this 12th day of September 1972.

(SEAL)
Attest:

EDWARD M.FLETCHER,JR.
Attesting Officer

ROBERT GOTTSCHALK
Commissioner of Patents